(12) United States Patent
Klapatch

(10) Patent No.: US 8,446,050 B2
(45) Date of Patent: May 21, 2013

(54) SOLID-STATE ALTERNATING CURRENT (AC) SWITCH

(75) Inventor: Robert D. Klapatch, Wethersfield, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 170 days.

(21) Appl. No.: 12/640,548

(22) Filed: Dec. 17, 2009

(65) Prior Publication Data

US 2011/0148505 A1 Jun. 23, 2011

(51) Int. Cl.
*H02B 1/24* (2006.01)

(52) U.S. Cl.
USPC ......... 307/128; 307/141.8; 307/127; 327/434

(58) Field of Classification Search
USPC .............................................. 307/128, 141.8
See application file for complete search history.

(56) References Cited

U.S. PATENT DOCUMENTS

| | | | |
|---|---|---|---|
| 7,196,436 B2 * | 3/2007 | Kugelman | 307/141.8 |
| 7,911,086 B2 * | 3/2011 | Amanuma | 307/115 |
| 2004/0207454 A1 * | 10/2004 | Hidaka et al. | 327/427 |

FOREIGN PATENT DOCUMENTS

GB 2415099 A 12/2005

OTHER PUBLICATIONS

Extended European Search Report of the European Patent Office in foreign counterpart application No. EP10252147.3, dated May 23, 2011, filed Dec. 17, 2010.

* cited by examiner

*Primary Examiner* — Rexford Barnie
*Assistant Examiner* — Toan Vu
(74) *Attorney, Agent, or Firm* — Kinney & Lange, P.A.

(57) ABSTRACT

A solid-state alternating current (AC) switch provides for the sequential turn-on of the associated solid-state switches to reduce the generation of electromagnetic interference (EMI). The solid-state AC switch includes at least first and second solid-state switches connected in series between an AC input and an AC load. A zero-cross detector circuit monitors the AC input to determine zero-crossings associated with the monitored AC input. A controller turns on the first solid-state switch and the second solid-state switch according to a turn-on sequence in which the first transistor is turned ON during a detected zero-crossing window associated with the first transistor and the second transistor is subsequently turned ON during a detected zero-crossing associated with the second transistor.

4 Claims, 4 Drawing Sheets

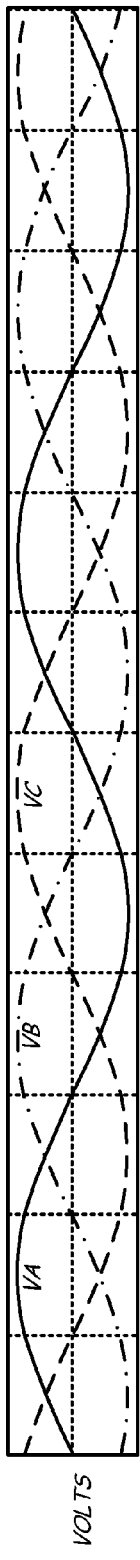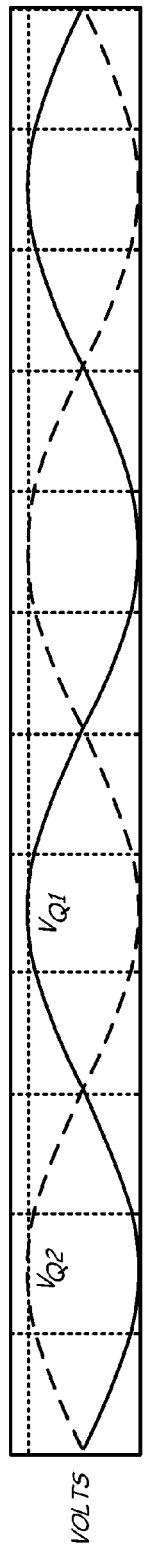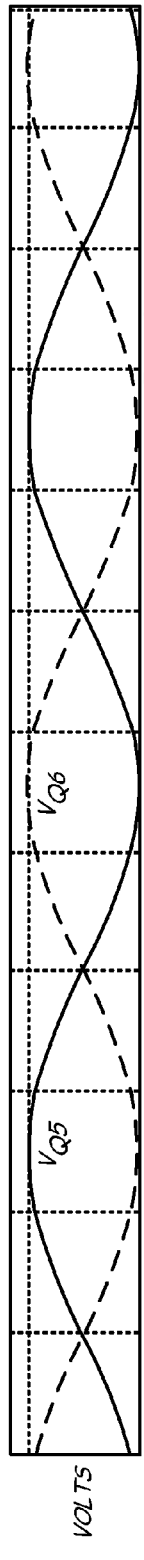

SOLID-STATE ALTERNATING CURRENT (AC) SWITCH

BACKGROUND

The present invention is related to solid-state alternating current (AC) switches, and in particular to a solid-state AC switch that provides low electro-magnetic interference (EMI).

Solid-state AC switches are employed to control the supply of AC power to loads. A solid-state AC switch typically includes a pair of metal-oxide semiconductor field-effect transistors (MOSFETs) connected in series with one another. The source of a first transistor is connected to the AC input, with the drain/source of the first transistor connected to the drain/source of the second transistor. By selectively controlling the gate voltages of both the first transistor and the second transistor, the solid-state AC switch selectively supplies an AC input power to the respective AC load.

A pair of series connected semiconductor transistors is required to account for the positive and negative half-cycle of the AC input. A transistor acts like a diode when OFF (i.e., non-conducting), allowing uni-directional flow of power across the forward biased body diode of the transistor. Therefore, the first series-connected transistor prevents the flow of current during the positive half-cycle of the AC waveform and the second series-connected transistor prevents the flow of current during the negative half-cycle of the AC waveform.

Electromagnetic interference (EMI) is added to the AC source during turn-on of the solid-state AC switch if the current through the transistors is non-zero. Prior art embodiments therefore attempt to synchronize the turn-on of the first and second transistors with zero-crossings of the AC waveform. However, capacitance associated with each transistor (i.e., the Miller Effect) results in the storage and subsequent undesirable flow of current during turn-on of the solid-state AC switch that contributes to EMI generation.

SUMMARY

A solid-state alternating current (AC) switch for connection between an AC input and an AC load includes at least a first and second solid-state switch connected in series with on another, a zero-crossing detector circuit, and a controller circuit. The zero-cross detector circuit monitors the AC input to determine zero-crossings associated with the monitored AC input. The controller turns on the first solid-state switch and the second solid-state switch according to a turn-on sequence in which the first transistor is turned ON during a detected zero-crossing associated with the first transistor and the second transistor is subsequently turned ON during a detected zero-crossing associated with the second transistor.

BRIEF DESCRIPTION OF THE DRAWINGS

FIGS. 3A-3D are graphs illustrating the turn-on of a solid-state AC switch as known in the prior art.

DETAILED DESCRIPTION

A solid-state alternating-current (AC) switch includes bias resistors for providing zero-crossing windows and a turn-on sequence that prevents voltage steps at turn-on that would otherwise contribute to the generation of electromagnetic interference (EMI).

Figure 1:
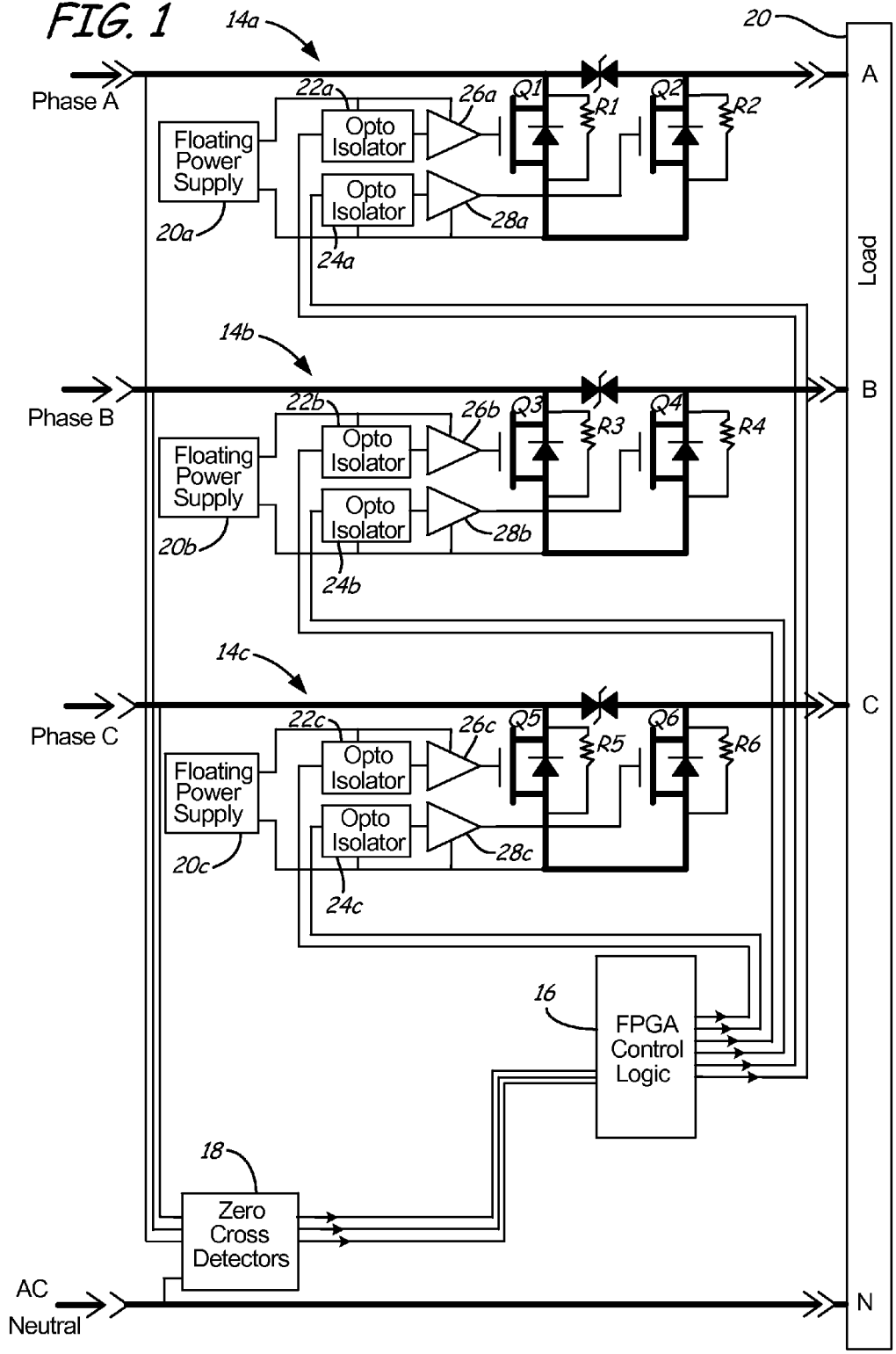
FIG. 1 is a circuit diagram of a solid-state alternating current (AC) switch according to an embodiment of the present invention.

FIG. 1 is a circuit diagram of solid-state alternating current (AC) switch 10 according to an embodiment of the present invention. Solid-state AC switch 10 includes switch components 14a, 14b, and 14c, control circuit 16 and zero-cross detector circuit 18 for selectively applying an AC input voltage to load 20. Switch components 14a, 14b and 14c (collectively switch components 14) are connected to phase A, phase B and phase C, respectively of the AC input. Each switch component 14 includes the same components. For example, switch component 14a includes floating power supply 20a, optical isolators 22a and 24a, amplifiers 26a and 28a, transistors Q1 and Q2, and bias resistors R1 and R2. Zero-cross detector circuit 18 monitors the AC input voltage and provides signals to control circuit 16 indicating when each respective phase of the AC input equals zero. In response, control circuit 16 provides control signals via optical isolators 22a and 24a and amplifiers 26a and 28a to control the gate voltage applied to transistors Q1 and Q2, respectively. In this way, control circuit 16 dictates whether transistors Q1-Q6 are ON (i.e., conducting) or OFF (i.e., non-conducting) as well as the timing of the turn-on of each respective transistor. For example, with respect to switch component 14a, in order to prevent the flow of current to load 20, transistors Q1 and Q2 are both maintained in an OFF state. Likewise, in order to supply the AC voltage (both positive and negative half-cycles) to load 20, both transistor Q1 and Q2 are turned ON.

Electromagnetic interference (EMI) is generated in the AC input when energy is discharged during turn-on of the transistors Q1-Q6. For example, if a voltage exists across the transistor at turn-on, the voltage step results in the flow of current into the AC input that results in undesirable EMI. In addition, transistors Q1-Q6 include an internal body diode and capacitance (i.e., Miller effect capacitance) that store energy that can be released at turn-on of the transistor, resulting in undesirable EMI. The present invention seeks to reduce voltage steps at turn-on by providing a turn-on sequence in which each transistor is turned ON during a zero-crossing window (i.e., window during which the voltage across the transistor is zero). In addition, the present invention employs bias resistors R1-R6 connected in parallel with transistor Q1-Q6, respectively, to discharge energy stored in the Miller effect capacitance of each transistor and to increase the duration of the zero-crossing window.

Figure 2:
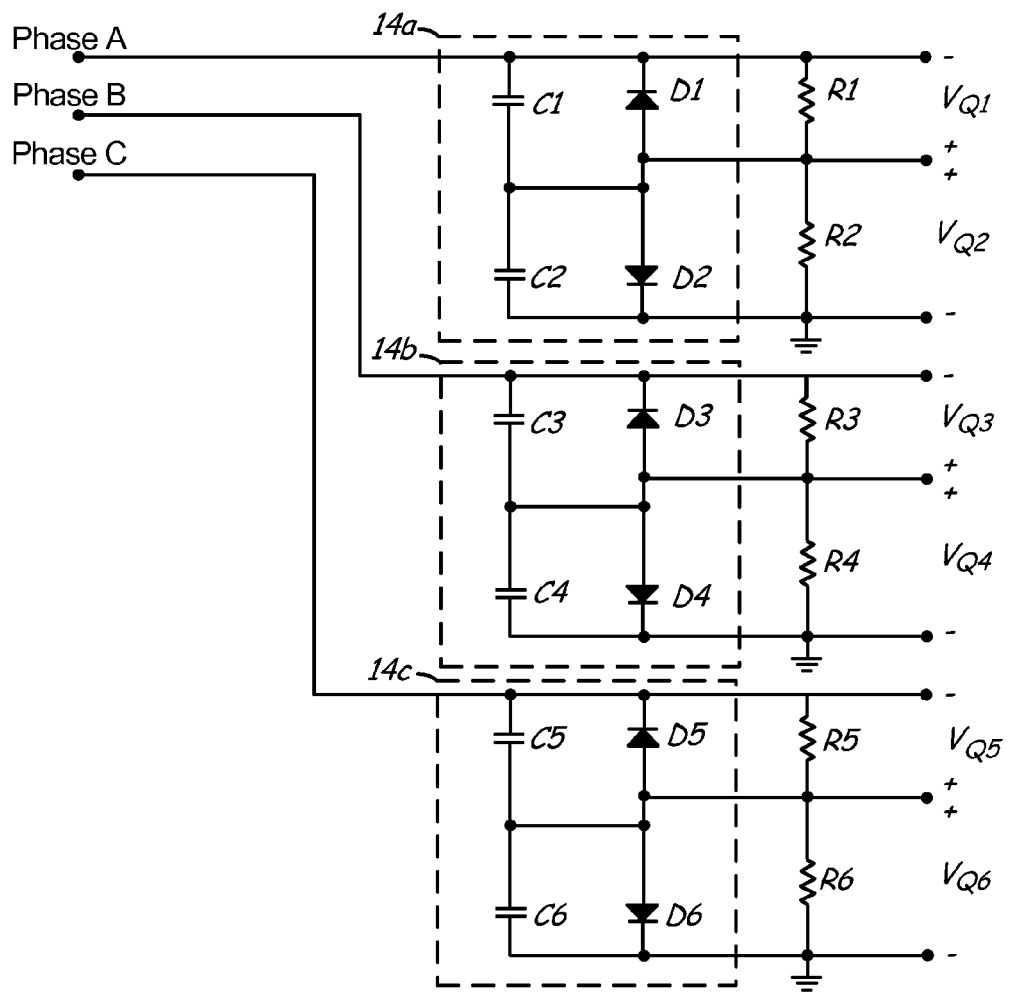
FIG. 2 is a hybrid circuit diagram of the capacitance and body diode associated with each solid-state transistor in the OFF state.

FIG. 2 is a hybrid circuit diagram of the capacitance and body diode associated with each solid-state transistor Q1-Q6 in the OFF state. For example, transistor Q1 in switch component 14a is represented by capacitor C1 and body diode D1. Transistor Q2 in switch component 14a is similarly represented by capacitor C2 and body diode D2. Transistors Q3 and Q4 in switch component 14b are represented by capacitor C3 and body diode D3, and capacitors C4 and body diode D4, respectively. Transistors Q5 and Q6 in switch component 14c are represented by capacitor C5 and body diode D5, and capacitor C6 and body diode D6. Voltage across each transistor Q1-Q6 is indicated by the voltages labeled $V_{Q1}$-$V_{Q6}$, respectively. To simplify the waveforms shown in FIGS. 3A-3D and 4A-4D, the polarity of the voltage across transistors $V_{Q1}$, $V_{Q3}$, and $V_{Q5}$ is inverted.

Electromagnetic interference (EMI) is generated by turning ON transistors Q1-Q6 when the voltage across that transistor is non-zero. In addition, the Miller effect capacitors C1-C6 store energy that is likewise communicated to the AC input voltage at turn-on of the respective transistor Q1-Q6. For example, during the negative half-cycle of phase A of the input voltage, diode D2 is forward biased resulting in charge being stored to capacitor C2 (assuming the presence of bias resistors R1 and R2 is ignored). At turn-on of transistors Q1 and Q2, energy stored by capacitor C2 is discharged to the AC input source. Bias resistors R1-R6 act to discharge the buildup of charge on the respective capacitors and such that a longer duration zero-crossing turn-on window is provided for control circuit 16 to turn-on each transistor.

In addition, control circuit 16 provides a specific turn-on sequence for each transistor Q1-Q6 in which during a particular half-cycle the transistor represented by a forward biased diode is turned ON. With respect to switch component 14a, during the positive half cycle of phase A, transistor Q2 would be turned ON during the zero-crossing window of transistor Q2, while transistor Q1 would remain OFF. Though transistor Q2 is conducting, the flow of current to load 20 is prevented by the reversed-biased body diode of transistor Q1. At the start of the negative half cycle, body diode D1 becomes forward biased such that no voltage step exists across transistor Q1, and transistor Q1 can be turned ON without the generation of EMI onto the AC input. A similar turn-on sequence is employed for switch components 14b and 14c. A benefit of this "half switch" turn-on sequence is no current flows into load 20 at turn-on, and therefore no reflected voltages due to the induction of load 20 are provided across the respective transistors. Subsequent turn-on of the remaining transistors as they become forward-biased ensures that no voltage step is present across the transistors being turned ON, and therefore EMI at the AC input is reduced.

FIGS. 3A-3D are graphs illustrating a simulated turn-on of a solid-state AC switch, without the benefit of bias resistors R1-R6 connected in parallel with each transistor Q1-Q6 and without the benefit of a turn-on sequence for negating the Miller effect capacitance C1-C6. Reference is made to FIG. 3A is a graph illustrating the AC input voltage Va, Vb and Vc provided by the AC source. FIGS. 3B, 3C, and 3D illustrate the voltages $V_{Q1}$, $V_{Q2}$, $V_{Q3}$, $V_{Q4}$, $V_{Q5}$, and $V_{Q6}$ across transistors Q1, Q2, Q3, Q4, Q5 and Q6, respectively. The polarity of each monitored transistor voltage is based on the polarity illustrated in FIG. 2.

For example, FIG. 3B illustrates the voltage $V_{Q1}$ and $V_{Q2}$ across transistors Q1 and Q2, respectively, in response to phase A of the AC input voltage shown in FIG. 3A. The simulation illustrates the effect of the Miller capacitance and body diodes associated with transistors Q1 and Q2 in providing a small zero-crossing turn-on window. In particular, the body diodes D1 and D2 charge the capacitance C2 and C1 of the opposite MOSFET even when the input phase voltage is zero. As a result, the zero-crossing window is very narrow.

Figure 4A:
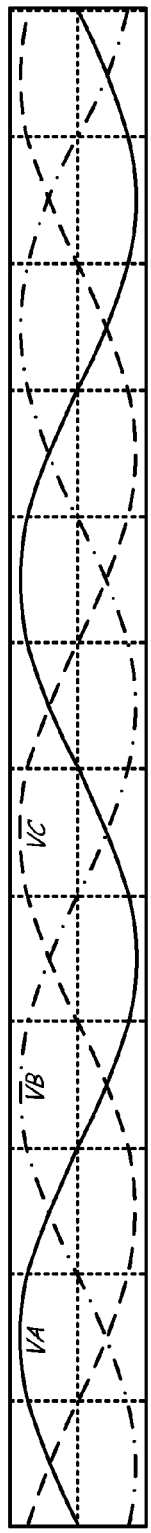
FIGS. 4A-4D are graphs illustrating the turn-on of a solid-state AC switch according to an embodiment of the present invention.
Figure 4B:
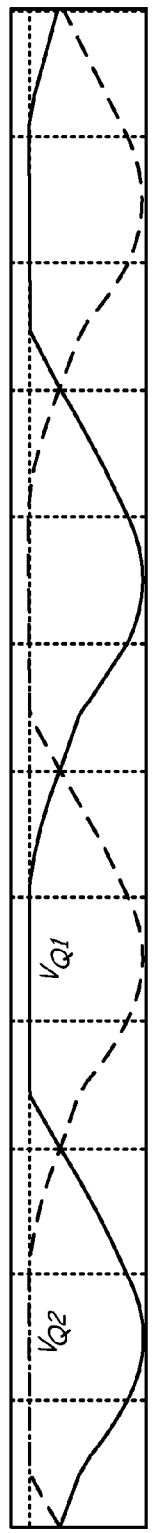
Figure 4C:
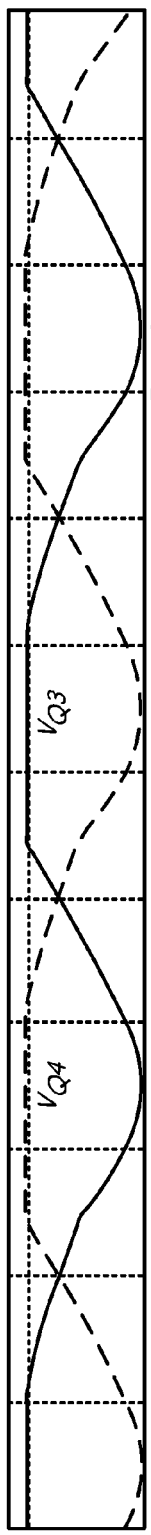
Figure 4D:
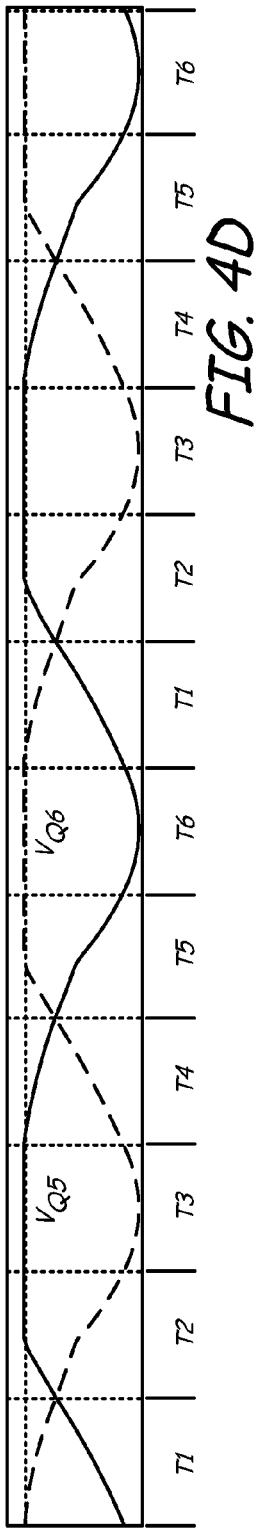

FIGS. 4A-4D are graphs illustrating the simulated turn-on of a solid-state AC switch according to an embodiment of the present invention. FIG. 4A is a graph illustrating the AC input voltage Va, Vb and Vc provided by the AC source. FIGS. 4B, 4C, and 4D illustrate the voltages $V_{Q1}$, $V_{Q2}$, $V_{Q3}$, $V_{Q4}$, $V_{Q5}$, and $V_{Q6}$ across transistors Q1, Q2, Q3, Q4, Q5 and Q6, respectively, as a result of placing bias resistors R1-R6 in parallel with transistors Q1-Q6 and employing a sequenced turn-on of the respective transistors according to an embodiment of the present invention.

For example, FIG. 4B illustrates the voltage $V_{Q1}$ and $V_{Q2}$ across transistors Q1 and Q2, respectively. Each transistor now has a longer duration zero-crossing window during which the voltage across the respective transistor is equal to the voltage drop across the body diode (i.e., approximately zero). The addition of bias resistors R1 and R2 provide a time window in which respective transistors Q1 and Q2 can be turned ON without a step voltage across the respective transistor. For example, during the positive half-cycle of AC input voltage Va (time intervals T1, T2, and T3), the voltage $V_{Q1}$ across transistor Q1 varies with the magnitude of the AC input voltage as body diode D1 is reverse biased. However, the voltage $V_{Q2}$ across transistor Q2 is equal to the voltage drop across body diode D2 as body diode D2 is lightly forward biased. During this interval, transistor Q2 can be turned ON without creating a voltage step across the transistor at turn-on. In this way, bias resistors R1-R6 increase the duration of zero-current windows to allow each transistor to be turned ON without significant voltage steps existing across the transistor being turned ON.

In addition, the present invention provides a specific turn-on sequence in which only one transistor associated with each AC input voltage phase is turned ON (i.e., a so-called "half-switch" turn-on of the AC switch). Zero-crossing detect circuit 18 monitors the zero-crossings of the three-phase AC input voltage and detects the position of the AC cycle. In the embodiment shown in FIGS. 4A-4D, a complete cycle of the AC input voltage is divided into six time intervals T1-T6, which are detected by zero-crossing detect circuit 18 and used by control circuit 16 to control the sequential turn-on of transistors Q1-Q6. The half-switch turn-on sequence prevents motor load voltages from being reflected into the other phases. In the example provided in FIGS. 4A-4D, the following sequence of transistor turn-on is employed to ensure each transistor is turned ON without a voltage step existing across the respective transistor.

In the embodiment shown in FIGS. 4A-4D, in response to cycle information provided by zero-crossing detect circuit 18 indicating that the position of the AC waveform, control circuit 16 turns ON, in order, transistors Q2, Q5, and Q4. Each transistor is turned ON during the respective zero-crossing window of the transistor to prevent voltage steps across the transistors at turn on. In one embodiment, control circuit 16 determines the turn-on time of each transistor based on detected zero-crossings provided by zero-crossing detection circuit 18. In other embodiments, control circuit 16 may include a timer (derived from the AC input voltage or maintained internally) that is used to determine the intervals of time between turn-on of each transistor.

At this point in the turn-on sequence, one transistor associated with each phase is turned ON, but current does not flow into any phase of load 20 because the series-connected transistor associated with each phase remains (i.e., the body diode associated with the OFF transistor remains reverse-biased). A benefit of turning ON half of the transistors is that the voltages across each transistor remain predictable so long as no current is flowing into load 20. Once current begins flowing into the load (typically a motor with windings), voltages are induced by the load back onto the other phase windings resulting in reflective voltages across the transistors.

As each of the phase voltages changes polarity (e.g., as phase A transitions from a positive polarity to a negative polarity at time interval T4) the body diodes associated with the transistors that were left OFF during the half turn-on cycle begin to become forward biased and start conducting. Once a forward biased transistor begins conducting, the voltage across the transistor is essentially zero, such that the transistor can be turned ON without the presence of an EMI-inducing voltage step.

In the example shown in FIGS. 4A-4D, transistor Q1 becomes forward biased first and is turned ON by control logic 16 at the negative peak value of phase A. Transistor Q6 becomes forward biased next and is turned ON by control logic 16 at the positive peak value of phase C. Transistor Q3 becomes forward biased last, and is turned ON at the negative peak value of phase B. Controlling turn-on at the peak (either negative or positive) of the half-cycle ensures that the transistor is forward biased and conducting before turn-on is initiated. This also ensures that any second-order effects due to motor reflected voltages from other phases do not contribute to the generation of EMI.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A solid-state alternating current (AC) power switch circuit for connection between an AC input and an AC load, the solid-state AC power switch comprising:
   a first solid-state switch connected to block a first half-cycle of the AC input when OFF,
   a first bias resistor connected in parallel with the first solid-state switch;
   a second solid-state switch connected in series with the first solid state switch to block a second half-cycle of the AC input when OFF;
   a second bias resistor connected in parallel with the second solid-state switch;
   a zero-cross detector circuit for monitoring the AC input to determine zero-crossings associated with the monitored AC input;
   a controller for turning ON the first solid-state switch and the second solid-state switch according to a turn-on sequence in which the first transistor is turned ON first during a detected zero-crossing window associated with the first solid-state switch and the second transistor is turned ON subsequently during a detected zero-crossing window of the second solid-state switch.

2. The solid-state AC switch circuit of claim 1, further including:
   a plurality of first and second solid-state pairs, wherein the controller turns ON a first solid-state switch associated with each pair prior to turning on the second solid-state switch associated with each pair.

3. The solid-state AC switch circuit of claim 2, wherein the first and second solid-state switches are metal-oxide semiconductor field effect transistors.

4. The solid-state AC power switch of claim 1, wherein the turn-on sequence provided by the controller is based, in addition to detected zero-crossing windows, on time intervals derived from the monitored AC input voltage.

\* \* \* \* \*